(12) United States Patent
Shi et al.

(10) Patent No.: US 7,871,506 B2
(45) Date of Patent: Jan. 18, 2011

(54) CONTINUOUS ARC DEPOSITION APPARATUS AND METHOD WITH MULTIPLE AVAILABLE TARGETS

(75) Inventors: Xu Shi, Singapore (SG); Li Kang Cheah, Singapore (SG)

(73) Assignee: Nanofilm Technologies International Pte Ltd, Singapore (SG)

( * ) Notice: Subject to any disclaimer, the term of this patent is extended or adjusted under 35 U.S.C. 154(b) by 993 days.

(21) Appl. No.: 11/065,168

(22) Filed: Feb. 23, 2005

(65) Prior Publication Data

US 2005/0199487 A1    Sep. 15, 2005

(30) Foreign Application Priority Data

Feb. 27, 2004   (GB)   ................... 0404436.8

(51) Int. Cl.
*C23C 14/34*   (2006.01)
(52) U.S. Cl. .................. 204/298.41; 204/298.04; 204/298.12; 204/298.23; 204/298.26
(58) Field of Classification Search ............ 204/298.04, 204/298.12, 298.23, 298.26, 298.41
See application file for complete search history.

(56) References Cited

U.S. PATENT DOCUMENTS

| | | | | |
|---|---|---|---|---|
| 3,853,740 A | * | 12/1974 | Kunz ..................... | 204/298.12 |
| 5,518,596 A | * | 5/1996 | Anttila et al. .......... | 204/192.38 |
| 6,031,239 A | | 2/2000 | Shi et al. | |
| 6,224,718 B1 | * | 5/2001 | Meyer .................... | 204/192.12 |
| 6,319,369 B1 | * | 11/2001 | Flynn et al. ............ | 204/192.38 |
| 6,416,635 B1 | * | 7/2002 | Hurwitt et al. ......... | 204/192.13 |

* cited by examiner

*Primary Examiner*—Nam X Nguyen
*Assistant Examiner*—Jason M Berman
(74) *Attorney, Agent, or Firm*—Bozicevic, Field & Francis LLP; Michael B. Rubin; Bret E. Field

(57) ABSTRACT

An arc deposition apparatus comprises an evacuatable chamber and means for positioning at least two targets in the chamber, wherein a first one of the at least two targets is positionable in an operative position and another of the at least two targets is positionable in a standby position. An electrical power supply is provided for supplying electrical power to the target held in the operative position to form an arc on an emission surface of the operative target. Means are provided for preparing an emission surface of the target positioned in the standby position to have a predetermined morphology. Alternatively, or in conjunction with the surface preparing means, means are provided for inspecting whether the emission surface of the target positioned in the standby position has a predetermined morphology. Preferably, the positioning means is configured to interchange the at least two targets at a predetermined time.

10 Claims, 2 Drawing Sheets

CONTINUOUS ARC DEPOSITION APPARATUS AND METHOD WITH MULTIPLE AVAILABLE TARGETS

BACKGROUND OF THE INVENTION

The present invention relates to arc deposition apparatus. More specifically, this invention relates to improved filtered cathodic vacuum arc apparatus and methods of use thereof utilising multiple available targets.

A number of plasma-based deposition methods have in recent years replaced sputtering systems as the desirable means of depositing thin coatings on a wide range of substrates.

Arc deposition processes generally include applying an electric field between a cathode target and an anode, both of which are located within an evacuated chamber. Free electrons flow from the cathode to the anode, creating a plasma vapour of positively charged target ions and negatively charged electrons in the chamber, the ions moving along a line of sight away from the target. A substrate to be coated is placed within the chamber in the line of sight of the target and therefore is coated by the ions.

Arc deposition apparatus, such as Filtered cathodic vacuum arc (FCVA) deposition apparatus, employ low pressures within the chamber during operation. The targets of these devices typically last about 10,000 operational seconds. Once a target has been depleted the chamber has to be opened in order that the targets can be replaced. Due to the low pressures used within the chamber, it can take more than one day to reestablish the required vacuum.

Present FCVA devices commonly employ the use of a graphite target to provide a tetrahedral amorphous carbon (ta-C) coating on a given substrate. In use, emission of ions from the target can be localized, resulting in an uneven target emission surface. The target emission surface therefore requires frequent grinding so that the deposition surface is as uniform as possible. Grinding must be performed off-line, resulting in unwanted operational downtime.

It is an object of at least a preferred embodiment of the present invention to overcome or ameliorate at least one of the problems of the prior art, or to provide a useful alternative thereto.

SUMMARY OF THE INVENTION

According to a first aspect of the invention there is provided an arc deposition apparatus comprising:
  an evacuatable chamber;
  means for positioning at least two targets in the chamber, wherein a first one of the at least two targets is positionable in an operative position and another of the at least two targets is positionable in a standby position;
  an electrical power supply for supplying electrical power to the target held in the operative position to form an arc on an emission surface of the operative target; and:
    means for preparing an emission surface of the target positioned in the standby position to have a predetermined morphology; and/or
    means for inspecting whether the emission surface of the target positioned in the standby position has a predetermined morphology.

Advantageously, the positioning means and preparing means provide for a longer continuous use of arc deposition apparatus when compared with conventional apparatus, without the need to re-pressurise and re-evacuate the chamber.

Also advantageously, the inspecting means can provide for more efficient preparation of the target emission surface.

Preferably, the inspecting means is a laser distance sensor. Alternatively, the inspecting step is performed by an infrared (IR) distance sensor, an ultraviolet (UV) distance sensor, an optical distance sensor or a mechanical distance sensor.

Also preferably, the predetermined morphology is a flat emission surface. As will be understood by the skilled addressee, the term "flat" is not to be interpreted narrowly, but rather can mean substantially flat, or at least flat enough to provide for a substantially consistent arc when the apparatus is in use.

Preferably, the positioning means is configured to interchange the at least two targets at a predetermined time.

Preferably, the positioning means comprises a rotatable support. This allows for convenient interchanging of the targets within the chamber.

Preferably, the preparing means comprises a grinder for grinding the emission surface of the target in the standby position. Preferably, each of the targets is rotatable about its respective rotational axis when in the standby position. This ability to rotate can aid in the grinding process.

Preferably, the chamber comprises a port for hermetic connection in fluid communication with a secondary chamber, the secondary chamber being adapted to contain a substrate to be deposited upon.

Preferably, the targets are selected from one of graphite, aluminium, chromium, titanium, nickel, iron, steel, copper, tantalum, or a mixture or alloy thereof. Alternatively, the first said target is selected from one of graphite, aluminium, chromium, titanium, nickel, iron, steel, copper, tantalum, or a mixture or alloy thereof, and another of the targets is different to the first said target and is selected from one of graphite, aluminium, chromium, titanium, nickel, iron, steel, copper, tantalum, or a mixture or alloy thereof.

Preferably, the apparatus comprises a floating insulator positionable adjacent the emission surface of the target in the operative position.

According to another aspect of the invention there is provided an arc deposition method for coating a substrate with ions, comprising the steps of:
  positioning at least two targets in an evacuatable chamber, wherein a first one of the at least two targets is positionable in an operative position and another of the at least two targets is positionable in a standby position;
  supplying electrical power to the target held in the operative position to form an arc on an emission surface of the operative target to provide a plasma from the operative target; and,
  while the electrical power is supplied to the target held in the operative position:
    preparing an emission surface of the target positioned in the standby position to have a predetermined morphology; and/or
    inspecting whether the emission surface of the target positioned in the standby position has a predetermined morphology.

Preferably, the at least two targets are interchanged at a predetermined time.

Preferably, the step of preparing an emission surface comprises grinding the emission surface of the target in the standby position.

Preferably, the step of inspecting is performed by a laser distance sensor. Alternatively, the inspecting step is performed by an infrared (IR) distance sensor, an ultraviolet (UV) distance sensor, an optical distance sensor or a mechanical distance sensor.

According to yet another aspect of the invention there is provided a system for determining when an emission surface of a target for use in an arc deposition process is suitable for use, the system comprising means for inspecting whether the emission surface has a predetermined morphology.

Preferably, the inspecting means is a laser distance sensor for scanning the emission surface.

Preferably, the predetermined morphology is a flat emission surface.

Preferably, the system comprises means for preparing the emission surface to be in the form of the predetermined morphology.

Also preferably, the system comprises a controller adapted to stop the preparing means when the inspecting means detects that the predetermined morphology of the emission surface has been realised.

Preferably, the system is operable when the target is within an evacuatable chamber.

BRIEF DESCRIPTION OF THE DRAWINGS

Preferred embodiments of the invention will now be described, by way of example only, with reference to the accompanying drawings in which.

DETAILED DESCRIPTION OF THE PREFERRED EMBODIMENTS OF THE INVENTION

Referring to the Figures, a preferred embodiment of the invention is an arc deposition apparatus in the form of an FCVA apparatus 10. The apparatus 10 comprises an evacuatable chamber 12 having a port 13 for hermetic attachment thereto by a secondary chamber (not shown). The secondary chamber is adapted to house substrates to be coated by the apparatus 10 when in use. A double bend tube configuration, as described in U.S. Pat. No. 6,031,239, may be provided between the apparatus 10 and the secondary chamber.

The chamber 12 houses first and second targets 14 and 16 for the deposition process. While the preferred embodiment is configured for the use of two targets, it will be understood that in alternative embodiments it may be configured for use with three or more targets. The targets in the preferred embodiment are cylindrical in shape, however may be configured in other shapes depending on the requirements of the apparatus.

Figure 1:
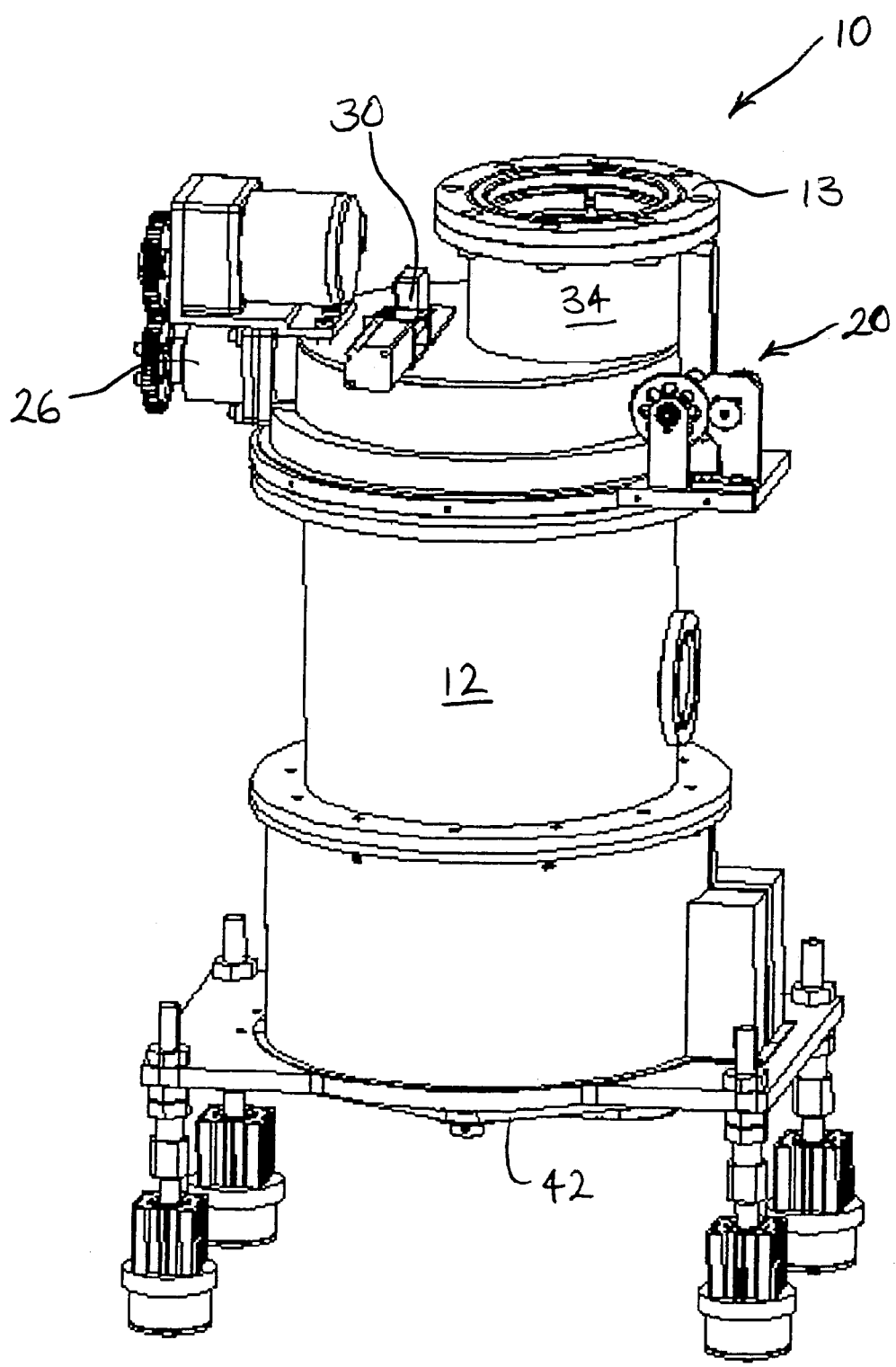
FIG. 1 is a perspective view of an arc deposition apparatus according to the present invention.
Figure 2:
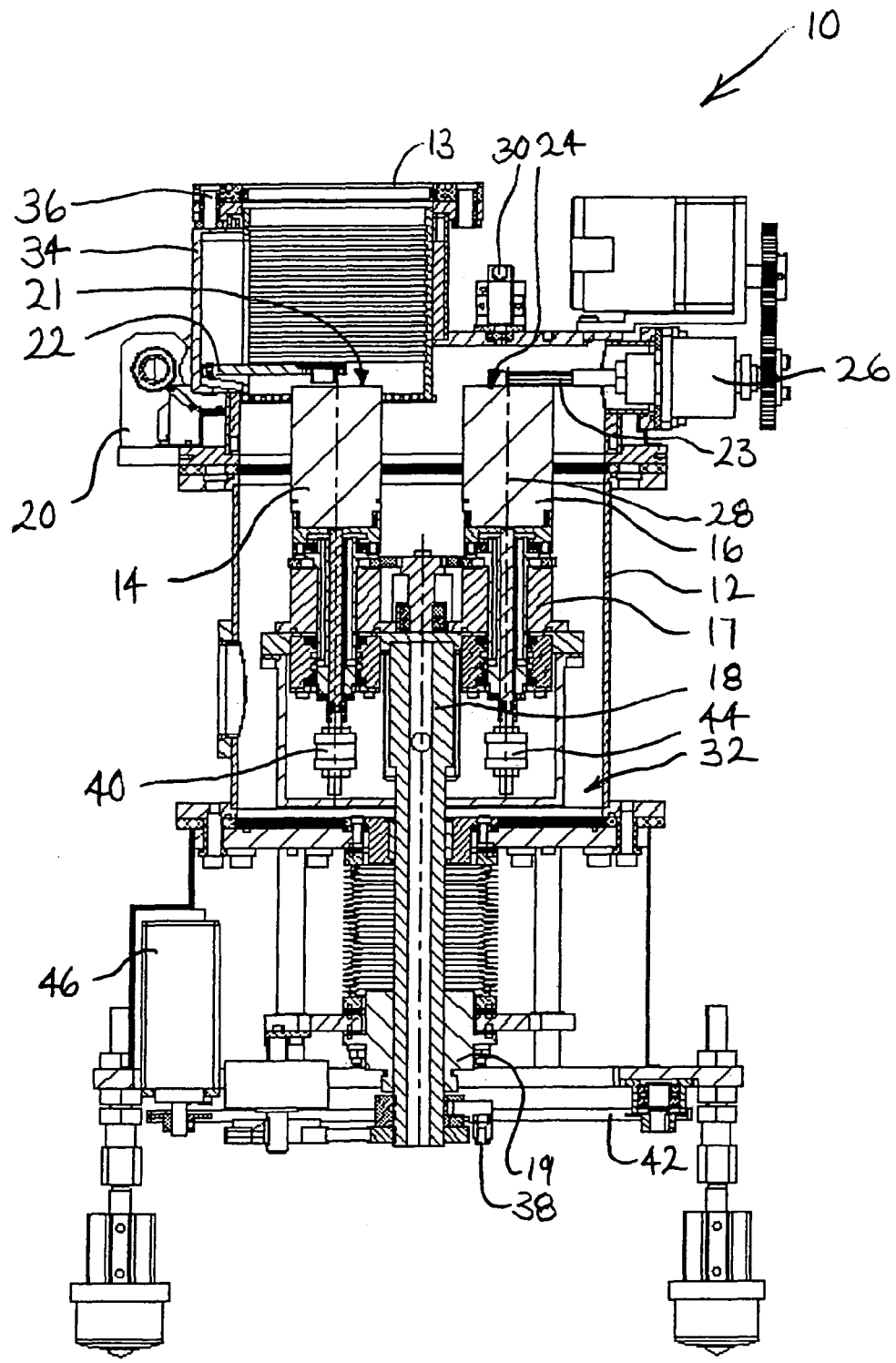
FIG. 2 is a sectioned rear elevation of the apparatus illustrated in FIG. 1.

As illustrated in FIG. 1, the first target 14 is in an online (operative) position and the second target 16 is in an off line (standby) position. Positioning means in the form of a rotatable support 17 is employed for positioning the targets 14 and 16 in the online or offline position in the chamber 12. The rotatable support 17 comprises a central shaft 18 and is rotatable about a central axis thereof by a rotation mechanism 19.

An electrical power supply 20 is connectable to the target in the online position (the first target 14 as illustrated in FIG. 1) to form an arc on an emission surface 21 of the online target when in use. A striker 22 is employed to start the arc on the emission surface 21, the use of which is described in more detail below.

Means in the form of a grinder 23, for preparing the emission surface 24 of the offline target 16, is also provided and is driven by a grinder driver motor 26. The grinder 23 is configured to prepare the emission surface 24 by grinding the surface to have a predetermined morphology, being a flat emission surface. The offline target 16 is also configured to be rotatable about its own axis 28 to aid in the grinding process.

Means, in the form of a laser distance sensor 30, is also provided for inspecting when the grinder has provided a flat emission surface on the offline target 16. The sensor 30 is configured to scan the morphology of the emission surface 24. The sensor 30 may also by used to inspect the emission surface of a replacement offline target to determine whether the emission surface of the replacement target is suitably flat for use, or whether it requires grinding prior to use.

A bottom portion 32 of the chamber 12 acts as a dust collector to collect target refuse from the grinding process.

In use, the apparatus is controlled by the controller. The secondary chamber is hermetically attached to the chamber 12 and the chamber 12 evacuated to an operating pressure of about from 1 to $10 \times 10^{-6}$ Torr. The electrical power supply 20 is actuated by the controller and supplies electricity to the online target 14. The target acts as a cathode and a neck portion 34 of the chamber 12 acts as an anode. The striker 22, being in electrical communication with the neck portion 34, strikes the emission surface 21 of the online target 14 to aid in producing an arc thereon. Ions are emitted from the emission surface 21 to provide a plasma in the neck portion 34 above the online target 14. The ions exit the neck portion 34 via the port 13 and enter the secondary chamber to coat the substrates therein. The direction of movement of the ions is aided through the neck portion 34 of the chamber 12 by a magnetic field provided by magnetic coils 36. It is therefore preferable to provide the neck portion 34, so that the coils 36 can be operatively located with respect to the online target and not the offline target.

During the process, the online target 14 increases in temperature. Therefore, the online target 14 is supplied with coolant water via a feedthrough 38.

As previously explained, emission of ions from the emission surface 21 is usually uneven, resulting in an uneven, or non-flat, emission surface 21 over time. Therefore at a predetermined time, related to when the online target has reached an undesired unevenness through use, the controller stops the electrical supply to the online target, and the rotation mechanism 19 interchanges the two targets 14 and 16. In the preferred embodiment, the interchange process takes about 1 second, though in alternative arrangements may take up to 30 seconds.

The interchange of the targets 14 and 16 is achieved by several steps. Firstly, the electrical connection between the power supply 20 and the first target 14 is disconnected at an electrical connector 40 associated with the first target 14. The shaft 18 is then moved axially toward the base 42 of the apparatus 10 to lower the first target 14 from the neck portion 34. The shaft 18 is then rotated 180° about its axis to interchange the first and second targets 14 and 16. The shaft 18 is then moved axially away from the base 42 to place second target 16 into an online position and the first target 14 into an offline position. An electrical connector 44 associated with the second target 16 is then placed in electrical connection with the power supply 20 and the power supply actuated. The striker 22 is then employed to aid in providing an arc on the emission surface 24 of the second target to restart the arc and therefore the emission process. If required, a height adjuster 46 is used to adjust the axial position of the online target relative to the neck portion 34.

In an alternative arrangement, the online target is positioned immediately below the neck portion 34 in use. In this arrangement, when interchanging the targets 14 and 16, it is not necessary to perform the steps of moving the shaft 18 axially toward or away from the base 42, but merely to perform the step of rotating the shaft and support 1800.

During emission by the second target 16, the grinder motor 26 is actuated such that the grinder 23 prepares the emission surface 21 of the first target 14. To aid in the grinding process, the first target 16 is rotated about its axis. Also, during the grinding process, the sensor 30 scans the emission surface 21 of the first target 14 to assess whether enough of the surface 21 has been ground to provide a flat surface. The sensor 30 is arranged to perform a linear scan on a radius of the emission surface 21. Since the target is rotated during grinding, this allows for a full scan by the sensor 30 of the surface 21 with each 360° rotation. Once the surface 21 is determined to be flat, the grinding process is stopped.

The present invention has several advantages over the prior art. For example, preparation of a used target's emission surface can be performed offline within the evacuated chamber while another target is being utilised for the deposition process. Also, since the surface preparation is performed in the evacuated chamber, there is no need re-pressurise the chamber to remove the target, and then replace the target prior to again evacuating the chamber to operating pressure. As will be appreciated by those skilled in the art, it may take up to 24 hours of operational downtime td evacuate such a chamber to from 1 to $10 \times 10^{-6}$ Torr. The present invention eliminates this downtime.

Another advantage of the present invention is more consistent ion emission, and therefore higher quality of ion coating of substrates. Since it is possible to grind the targets within the chamber under vacuum, the grinding of a target can be performed more regularly. In prior art equipment, there is a tendency to use the targets for a relatively longer time period prior to grinding, due to the downtime required in removing targets from the chamber. The longer use of the targets prior to grinding resulted in more exaggerated pitting of the target surface and therefore less consistent ion emission. Since downtime is reduced in the present invention, it is possible to grind more frequently and therefore provide more consistent ion emission.

Yet another advantage of the present invention is due to the use of the laser sensor. Prior art sensing of the surface morphology of emission surfaces includes, for example, naked eye inspections, or using the striker to sense the radial profile. The laser sensor provides for more accurate assessment of the flatness of the emission surface and therefore only a minimum amount of surface grinding is required. This results in more efficient use of the targets, reducing operating and consumables costs.

In the preferred embodiment, the first and second targets 14 and 16 comprise graphite, to provide a ta-C coating on the substrates in the secondary chamber. In alternative embodiments, the targets may comprise any one of aluminium, chromium, titanium, nickel, iron, steel, copper, tantalum, or a mixture or alloy thereof. In another alternative embodiment, the first and second targets may be of different composition, chosen from one of aluminium, chromium, titanium, nickel, iron, steel, copper, tantalum, or a mixture or alloy thereof. In this latter embodiment, a substrate may be coated in alternating layers of the chosen target materials.

The type of substrate that may be coated by the arc deposition apparatus of the present invention will depend on the target used, and the required resultant properties of the substrate. For example, graphite targets may be used to provide a thin, scratch resistant ta-C layer on the surface of a disc recording medium.

In another alternative embodiment, a floating insulator is employed adjacent the emission surface of the online target. The floating insulator, typically boronitride, prevents the arc from moving off an edge of the emission surface.

Also, while the preferred embodiment of the invention has been described in reference to an FCVA apparatus and process, it will be understood by the skilled addressee that the invention may be configured for use in continuous vacuum arc processes, or other arc processes.

As will be further understood by the skilled addressee, in an alternative arrangement of the invention, the apparatus comprises the grinder 23, but not the sensor 30. In this arrangement, the quality of the surface morphology of the offline, ground emission surface is inspected by eye to determine whether it is flat enough for use.

In another alternative arrangement, the apparatus comprises the sensor 30, but not the grinder 23. In this arrangement, the apparatus may be configured to use only one target, and employ the sensor 30 to determine when the target's emission surface is no longer suitable for use. Alternatively, the sensor 30 may be employed separately from the apparatus to determine whether the emission surface of an offline target has a flat surface suitable for use in an arc deposition process.

The invention has been described in reference to its preferred embodiments, it is to be understood that the words which have been used are words of description rather than limitation and that changes may be made to the invention without departing from its scope as defined by the appended claims.

The text of the abstract filed herewith is repeated here as part of the specification.

An arc deposition apparatus comprises an evacuatable chamber and means for positioning at least two targets in the chamber, wherein a first one of the at least two targets is positionable in an operative position and another of the at least two targets is positionable in a standby position. An electrical power supply is provided for supplying electrical power to the target held in the operative position to form an arc on an emission surface of the operative target. Means are provided for preparing an emission surface of the target positioned in the standby position to have a predetermined morphology. Alternatively, or in conjunction with the surface preparing means, means are provided for inspecting whether the emission surface of the target positioned in the standby position has a predetermined morphology. Preferably, the positioning means is configured to interchange the at least two targets at a predetermined time.

The invention claimed is:

1. An arc deposition apparatus comprising:
    an evacuatable chamber;
    a rotatable support disposed in said chamber for positioning at least two targets in the chamber, the rotatable support being configured to rotationally interchange said targets during arc deposition such that a first one of the at least two targets is positionable in an operative position and another of the at least two targets is positionable in a standby position;
    a shaft coupled to said rotatable support and having a bore extending therethrough and being configured to move said rotatable support about a substantially central axis of the chamber, wherein in use, the shaft rotates the support about the axis to interchange the targets and thereby enables one target to be positioned in the operative position while another target is positioned in the standby position;
    an electrical power supply for supplying electrical power to the target positioned in the operative position to form an arc on an emission surface of the target positioned in the operative position;

a surface preparation apparatus for preparing an emission surface of the target positioned in the standby position to have a predetermined morphology; and a sensor for inspecting whether the emission surface of the target positioned in the standby position has a predetermined morphology.

2. The apparatus of claim 1, wherein the surface preparation apparatus comprises a grinder for grinding the emission surface of the target positioned in the standby position.

3. The apparatus of claim 1, wherein each of the targets is rotatable about its respective rotational axis when positioned in the standby position.

4. The apparatus of claim 1, wherein the sensor is a laser distance sensor.

5. The apparatus of claim 1, wherein the predetermined morphology is a flat emission surface.

6. The apparatus of claim 1, wherein the chamber comprises a port for hermetic connection in fluid communication with a secondary chamber, the secondary chamber being adapted to contain a substrate to be deposited upon.

7. The apparatus of claim 1, wherein the targets are comprised of the same material and selected from the group consisting of graphite, aluminium, chromium, titanium, nickel, iron, steel, copper, tantalum, and mixtures or alloys thereof.

8. The apparatus of claim 1, wherein the first said target is selected from the group consisting of graphite, aluminium, chromium, titanium, nickel, iron, steel, copper, tantalum, and mixtures or alloys thereof, and another of the targets is different from the first said target and is selected from the group consisting of graphite, aluminium, chromium, titanium, nickel, iron, steel, copper, tantalum, and mixtures or alloys thereof.

9. The apparatus of claim 1, comprising a floating insulator positionable adjacent the emission surface of the target positioned in the operative position.

10. The apparatus of claim 1, comprising liquid cooler for cooling the at least two targets.

* * * * *